(12) United States Patent
Tamura et al.

(10) Patent No.: US 6,858,911 B2
(45) Date of Patent: Feb. 22, 2005

(54) MEMS ACTUATORS

(75) Inventors: Hirokazu Tamura, Wellsley, MA (US);
Matthew J. Neal, Marlborough, MA (US); Justin C. Borski, Webster, MA (US); Alan L. Sidman, Wellesley, MA (US)

(73) Assignees: Advanced Microsensors, Shrewsbury, MA (US); Furukawa American, Inc., Clinton, NJ (US)

( * ) Notice: Subject to any disclaimer, the term of this patent is extended or adjusted under 35 U.S.C. 154(b) by 272 days.

(21) Appl. No.: 10/309,951

(22) Filed: Dec. 4, 2002

(65) Prior Publication Data

US 2003/0155840 A1 Aug. 21, 2003

Related U.S. Application Data

(63) Continuation-in-part of application No. 10/079,985, filed on Feb. 21, 2002, now Pat. No. 6,717,227.
(60) Provisional application No. 60/418,853, filed on Oct. 16, 2002.

(51) Int. Cl.$^7$ ............................................. H01L 29/82
(52) U.S. Cl. ..................... 257/421; 369/119; 257/52; 257/254; 257/415; 257/419
(58) Field of Search ........................... 369/119; 257/52, 257/254, 415, 419

(56) References Cited

U.S. PATENT DOCUMENTS

| | | |
|---|---|---|
| 5,206,983 A | 5/1993 | Guckel et al. |
| 5,327,033 A | 7/1994 | Guckel et al. |
| 5,629,918 A | 5/1997 | Ho et al. |
| 5,644,177 A | 7/1997 | Guckel et al. |
| 5,778,513 A | 7/1998 | Miu et al. |
| 5,808,384 A | 9/1998 | Tabat et al. |
| 5,909,078 A | 6/1999 | Wood et al. |
| 5,929,542 A | 7/1999 | Ohnstein et al. |
| 5,994,816 A | 11/1999 | Dhuler et al. |
| 6,044,056 A * | 3/2000 | Wilde et al. ................ 369/119 |

(List continued on next page.)

FOREIGN PATENT DOCUMENTS

| | | |
|---|---|---|
| EP | 1 081722 | 3/2001 |
| EP | 1 164 601 | 12/2001 |
| WO | WO 00/05734 | 2/2000 |

OTHER PUBLICATIONS

International Search Report dated Apr. 2, 2004 and completed on Apr. 21, 2004.
Bhansali et al., "Prototype Feedback–Controlled Bidirectional Actuation System for MEMS Applications," Journal of Microelectromechanical Systems, 9 (2): 245–251 (Jun. 2000).

(List continued on next page.)

*Primary Examiner*—David Nelms
*Assistant Examiner*—Mai-Huong Tran
(74) *Attorney, Agent, or Firm*—Foley Hoag LLP

(57) ABSTRACT

A Microelectromechanical (MEMS) device that can minimize the effects of fabrication tolerances on the operation of the device can include a MEMS electromagnetic actuator to selectively generate displacement forces to displace an actuable element along a path. A cantilever can apply an opposing force to the actuable element to control the amount of displacement. Coil ends of the actuator can be shaped to vary a gap distance between the coil ends, and/or the magnetic portion of the actuable element may be shaped, so as to vary the force applied to the actuable element along the displacement axis. One or more pins located in the deflection path of the cantilever can contact the cantilever at one or more points so as to change the bending resistance of the cantilever. The cross-section of the cantilever can also be varied along its length so as to change the bending resistance of the cantilever.

40 Claims, 13 Drawing Sheets

U.S. PATENT DOCUMENTS

| | | |
|---|---|---|
| 6,085,016 A | 7/2000 | Espindola et al. |
| 6,087,743 A | 7/2000 | Guckel et al. |
| 6,122,149 A | 9/2000 | Zhang et al. |
| 6,137,941 A | 10/2000 | Robinson |
| 6,163,643 A | 12/2000 | Bergmann et al. |
| 6,166,478 A | 12/2000 | Yi et al. |
| 6,171,886 B1 | 1/2001 | Ghosh et al. |
| 6,173,105 B1 | 1/2001 | Aksyuk et al. |
| 6,222,954 B1 | 4/2001 | Riza |
| 6,246,826 B1 | 6/2001 | O'Keefe et al. |
| 6,255,757 B1 | 7/2001 | Dhuler et al. |
| 6,262,463 B1 | 7/2001 | Miu et al. |
| 6,265,239 B1 | 7/2001 | Aksyuk et al. |
| 6,275,320 B1 | 8/2001 | Dhuler et al. |
| 6,285,504 B1 | 9/2001 | Diemeer |
| 6,300,619 B1 | 10/2001 | Aksyuk et al. |
| 6,308,631 B1 | 10/2001 | Smith et al. |
| 6,324,748 B1 | 12/2001 | Dhuler et al. |
| 6,327,855 B1 | 12/2001 | Hill et al. |

OTHER PUBLICATIONS

Stephen Cohen, "Novel VOAs Provide More Speed and Utility," Laser Focus World, pp. 139–146 (Nov. 2000).

Christenson and Guckel, "An Electromagnetic Micro Dynamometer," 1995 IEEE MEMS Proceedings, Amsterdam, the Netherlands, pp. 386–391, Jan. 29–Feb. 2, 1995.

Gong and Zhou, "Micromachined Electromagnetic Actuator," Proceedings of the International Symposium on Test & Measurement, ISTM. pp. 23–26 (1999).

Guckel et al., "Laterally Driven Electromagnetic Actuators," Solid–State Sensor and Actuator Workshop, Hilton Head, South Carolina, pp. 49–52 (Jun. 13–16,1994).

Guckel et al., "Design and Testing of Planar Magnetic Micromotors Fabricated by Deep X–Ray Lithography and Electroplating," The 7$^{th}$ International Conference on Solid–State Sensors and Actuators, Yokohama, Japan, pp. 76–79, (Jun. 7–10, 1993).

Guckel et al., "Fabrication and Testing of the Planar Magnetic Micromotor," J. Micromech. Microeng. 1: 135–138, (1991).

Guckel et al., "Electromagnetic, Spring Constrained Linear Actuator with Large Throw," Actuator'94, pp. 52–55, (Bremen, Germany Jun. 15–17, 1994).

Guckel et al., "Micromechanics for Actuators Via Deep X–Ray Lithography," SPIE vol. 2194, pp. 2–10.

Guckel et al., "Processing and Design Considerations for High Force Output—Large Throw Electrostatics, Linear Microactuators," Actuator 94, Bremen, Germany pp. 105–108, (Jun. 15–17, 1994) (Abstract).

H. Guckel and University of Wisconsin, Madison, "Photograph of Actuator," online, retrieved on Feb. 1, 2002 from URL http://mems.engr.wisc.edu/images/linear/intgrated_coil.jpg.

Guckel et al., "Micro Electromagnetic Actuators Based on Deep X–Ray Lithography," International Symposium on Microsystems, Intelligent Materials and Robots, Sendai, Japan, Sep. 27–29, (1995) (Abstract).

Miyajima et al., "A Durable, Shock–Resistant Electromagnetic Optical Scanner with Polyimide–Based Hinges," Journal of Microelectromechanical Systems 10 (3): 418–424, (Sep. 2001).

Ohnstein et al., "Tunable IR Filters with Integral Electromagnetic Actuators," Solid–State Sensor and Actuator Workshop, Hilton Head, South Carolina, pp. 196–199, (Jun. 2–6, 1996).

Sadler et al., "A Universal Electromagnetic Microactuator Using Magnetic Interconnection Concepts," Journal of Microelectromechanical Systems 9(4): 460–468, (Dec. 2000).

Sadler et al., "A New Electromagnetic Actuator Using Through–Hole Plating of Nickel/ Iron Permalloy," Electrochemical Society Proceedings vol. 98(20): 377–388.

Wright et al., "A Large—Force, Fully–Integrated MEMS Magnetic Actuator," Transducers 97, International Conference on Solid–State Sensors and Actuators, pp. 793–796, (Chicago, Jun. 16–19, 1997).

\* cited by examiner

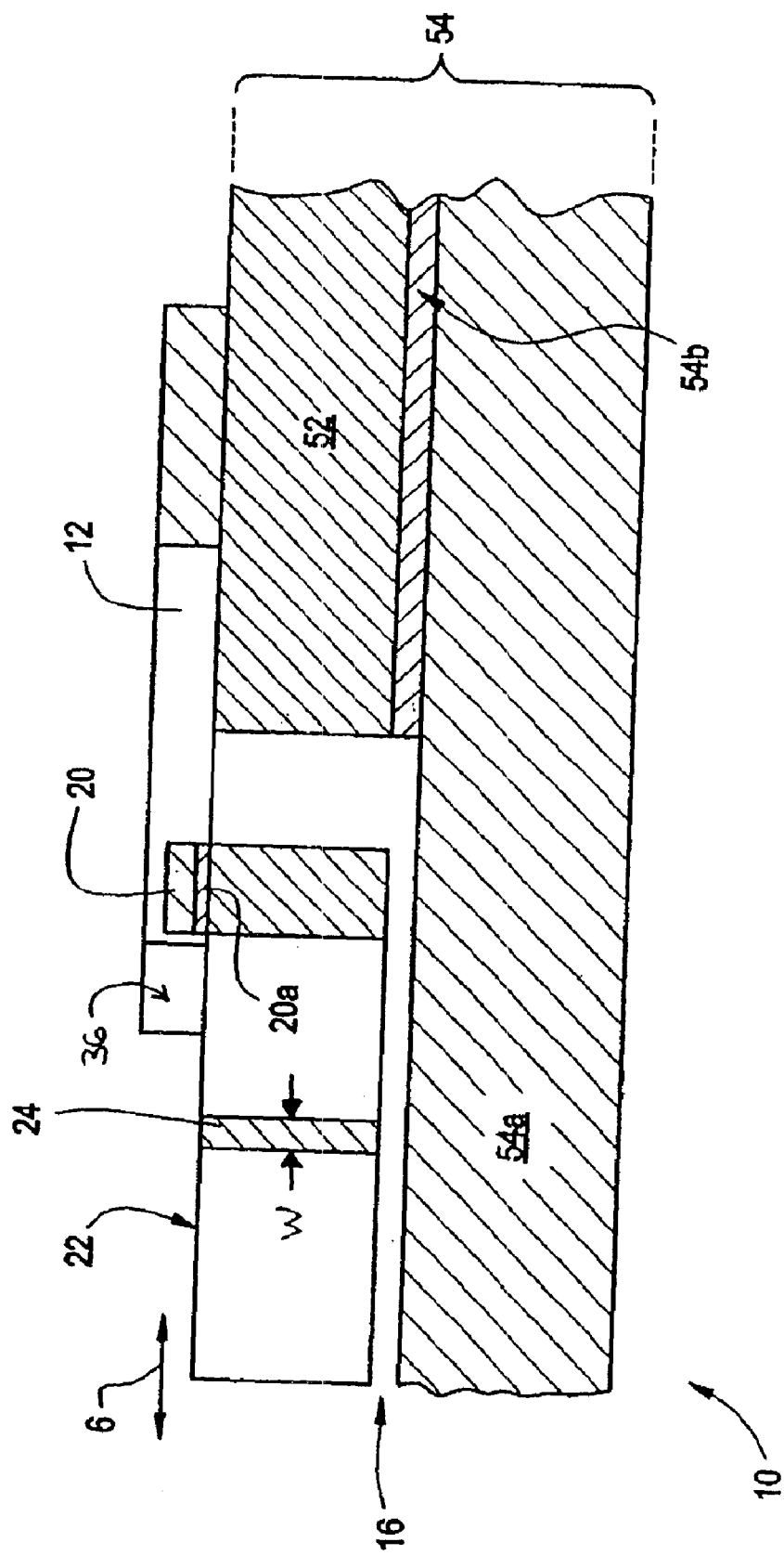

MEMS ACTUATORS

RELATED APPLICATIONS

This application claims priority to, and incorporates by reference, the entire disclosure of U.S. Provisional Patent Application No. 60/418,853, filed on Oct. 16, 2002 and is a continuation-in-part of U.S. patent application Ser. No. 10/079,985, filed Feb. 21, 2002 now U.S. Pat. No. 6,717,227 incorporated herein by reference.

BACKGROUND

Advances in micro-electronic fabrication technology have allowed the creation of Micro-Electrical Mechanical Systems (MEMS) capable of motion and applying force at the micron level. By using micro-electronic fabrication techniques, MEMS devices may be mass-produced in batches. However, during batch fabrication of MEMS devices, process variations and limitations, contaminants, and other factors can result in fabrication tolerances that give rise to substantial variation in device properties. In particular, it remains challenging to fabricate a plurality of MEMS devices having a precisely repeatable size and shape in order to ensure consistent operation.

SUMMARY

Disclosed herein are MEMS devices and methods of manufacturing MEMS devices that minimize the effect of fabrication tolerances on the properties of the devices.

In one exemplary embodiment, the MEMS device may include an actuable element having a magnetic portion comprising a magnetic material, and an electromagnetic MEMS actuator that includes an electrically conductive coil wound about a magnetic core. The coil and the magnetic core can be arranged to generate a magnetic field within a gap formed by spaced apart ends of the magnetic core upon application of a current to the coil. The actuable element may be displaceable along a displacement axis relative to the gap upon application of the magnetic field on the magnetic portion of the actuable element. The gap and/or the magnetic portion of the actuable element can vary along the displacement axis so as to vary the force applied to the actuable element along the displacement axis.

In another exemplary embodiment, a MEMS device can include an actuable element having a magnetic portion comprising a magnetic material, and an electromagnetic MEMS actuator comprising an electrically conductive coil wrapped around a core. The core can include a first end spaced apart from a second end by a gap distance to form a gap. The actuable element may be displaceable along a displacement axis that passes through the gap upon application of a magnetic field generated by the electromagnetic MEMS actuator on the magnetic portion of the actuable element. One or both of the core ends can be angled with reference to the displacement axis to vary a gap distance between the core ends. The angle with respect to the displacement axis can be greater than 45° and may be greater than 70°.

In a further exemplary embodiment, a MEMS device can include an actuable element having a magnetic portion comprising a magnetic material, and an electromagnetic MEMS actuator comprising an electrically conductive coil wrapped about a magnetic core. The actuator can be arranged to generate a magnetic field within a gap formed by spaced apart ends of the magnetic core upon application of a current to the coil. The actuable element may be positioned proximate the gap and may be displaceable along a displacement axis relative to the gap upon application of a magnetic field on the magnetic portion of the actuable element. The magnetic portion can have a first angled surface oriented at an angle to the displacement axis.

In certain exemplary embodiments, the magnetic portion can have a second angled surface oriented at an angle to the displacement axis and the first and second angled surfaces can be symmetrically oriented about the displacement axis. The angle with respect to the displacement axis can be greater than 45° and may be greater than 70°. The magnet portion can include a surface oriented parallel to the displacement axis.

In another embodiment, a MEMS device can include a substrate, an actuable element, an actuator disposed on the surface of the substrate for selectively applying a first force to the actuable element to displace the actuable element along a displacement path, at least one control mechanism, such as, for example, a cantilever, coupled to the actuable element at a first end and coupled to the substrate at a second end to control displacement of the actuable element along the displacement path and a pin coupled to the substrate and positioned in a deflection path of the control mechanism, the pin altering the deflection path of at least a portion of the control mechanism upon contact with the control mechanism.

The pin can have a contact surface configured to minimize stiction between the pin and the control mechanism, e.g., the cantilever. The contact surface can be coated with an anti-stiction coating and may be textured. The contact surface can be arcuate or cylindrical in shape or may have a polygonal cross-section. The pin can be positioned a distance D from the first end of the cantilever that is selected to increase the spring constant of the cantilever. The pin can be positioned a distance $D_x$ from the displacement path and a distance $D_y$ from a longitudinal axis of the cantilever. The MEMS device can further include a second pin coupled to the substrate and positioned in a deflection path of the cantilever. The cross-section of the cantilever, defined by a cantilever width W and a cantilever height H, can vary along the longitudinal axis of the cantilever by varying the width W and/or the height H along the longitudinal axis of the cantilever.

In yet another exemplary embodiment, the MEMS device can include a substrate, an actuable element having a magnetic portion comprising a magnetic material, and an electromagnetic MEMS actuator comprising an electrically conductive coil wound about a magnetic core. The coil and the magnetic core can be arranged to generate a magnetic field within a gap formed by spaced apart ends of the magnetic core upon application of a current to the coil. The actuable element can be displaceable along a displacement axis relative to the gap upon application of the magnetic field on the magnetic portion of the actuable element. First and second cantilevers can be respectively coupled to the actuable element at their respective first ends and can be respectively coupled to the substrate at their respective second ends. A pin can be coupled to the substrate and positioned in a deflection path of the first cantilever such that the pin can alter the deflection path of at least a portion of the first cantilever upon contact with the first cantilever.

In a further exemplary embodiment, a MEMS device can include a substrate, an actuable element, an actuator disposed on the surface of the substrate for selectively applying a first force to the actuable element to displace the actuable element along a displacement path, a mechanism, such as at least one cantilever coupled to the actuable element at a first end and coupled to the substrate at a second end, to control displacement of the actuable element along the displacement path and means for altering a spring constant of the mechanism, such as the bending resistance of the cantilever, during displacement of the actuable element.

BRIEF DESCRIPTION OF THE DRAWINGS

These and other features of the MEMS devices disclosed herein will be more fully understood by reference to the following detailed description in conjunction with the attached drawings. In the attached drawings, like reference numerals refer to like parts throughout the different views, and reference numerals that differ by increments of 100 refer to similar parts in different embodiments. While the drawings illustrate principles of the MEMS devices disclosed herein, they are not drawn to scale, but may show only relative dimensions.

FIG. 1B is a side elevation view of the MEMS device shown in FIG. 1A along the line A–A'.

DETAILED DESCRIPTION OF CERTAIN EXEMPLARY EMBODIMENTS

Figure 1A:
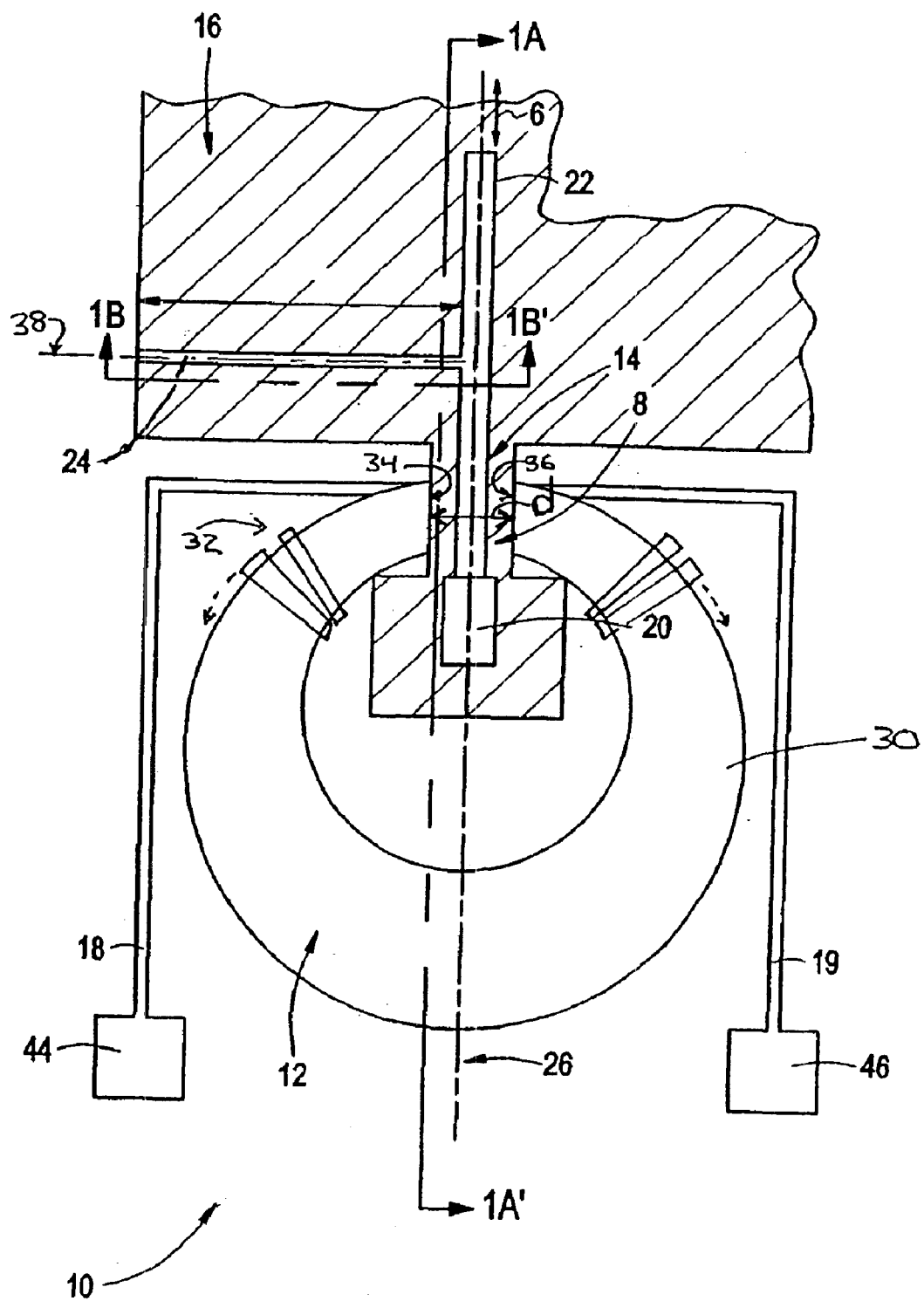
FIG. 1A is a top view of an embodiment of a MEMS device disclosed herein.

Certain exemplary embodiments will now be described to provide an overall understanding of the principles of the MEMS devices disclosed herein. One or more examples of these embodiments are illustrated in the drawings. Those of ordinary skill in the art will understand that the MEMS devices and methods of fabrication disclosed herein can be adapted and modified to provide devices and methods for other applications and that other additions and modifications can be made without departing from the scope of the present disclosure. For example, the features illustrated or described as part of one embodiment or one drawing can be used on another embodiment or another drawing to yield yet another embodiment. Such modifications and variations are intended to be included within the scope of the present disclosure.

Figure 1C:
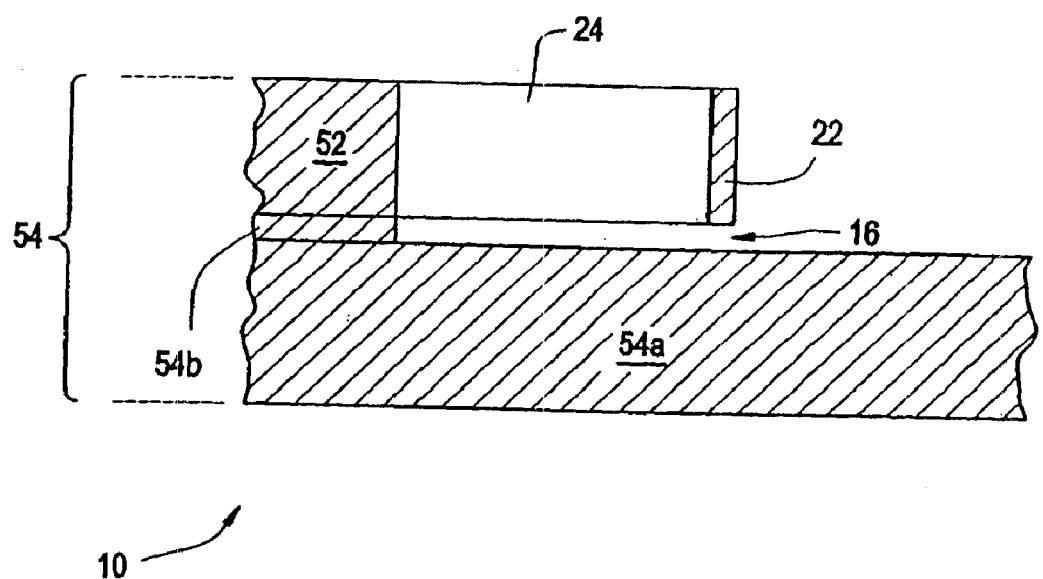
FIG. 1C is a side elevation view of the MEMS device shown in FIG. 1A along the line B–B'.

An exemplary embodiment of a MEMS device disposed on a substrate is shown in FIGS. 1A, 1B, and 1C. The MEMS device 10 can include a MEMS actuator 12 and an actuable element 14. In the exemplary embodiment, the MEMS actuator 12 can be an electromagnetic actuator, as described in greater detail in U.S. patent application Ser. No. 10/079,985, incorporated herein by reference in its entirety. Alternatively, the MEMS actuator may be another type of MEMS actuator such as, for example, an electrostatic, thermal, magnetostrictive, or piezoelectric actuator or any other type of MEMS actuator. The illustrated MEMS actuator 12 can include an electrically conductive coil arranged to generate a magnetic field with a gap 8 formed by the spaced-apart ends of the actuator 12 upon application of a current to the coil, as by first electrically conducting lead 18 and a second electrically conducting lead 19.

The actuable element 14 may be shaped to include a base 20 and an elongated arm 22 that can be coupled to and extend from the base 20. As discussed below, the base 20 or other portion of the actuable element 14 may include a layer or portion of magnetic material. The base 20 of the actuable element 14 may be positioned proximate the gap 8 such that the base 20 can be displaced relative to the gap 8 upon application of a magnetic field on the magnetic material of the actuable element 14. Optionally, a cantilever 24 or other mechanism for controlling the displacement of the actuable element may be coupled to the actuable element 14 at one end and to the substrate 54 at another end. Exemplary control mechanisms are disclosed in U.S. patent application Ser. No. 10/079,985, filed Feb. 21, 2002.

In the exemplary embodiment illustrated in FIGS. 1A, 1B, and 1C, the MEMS actuator 12 can be constructed on the surface of the substrate 54 and the actuable element 14 and the cantilever 24 can be constructed from the substrate 54, preferably from a top device layer 52 of the substrate 54. In this manner, the actuable element 14 and the cantilever 24 may be suspended over a cavity 16 (denoted by crosshatching in FIG. 1A) in the substrate 54 and thus may be free to be displaced relative to the substrate 54. Using the manufacturing processes as described in more detail in U.S. patent application Ser. No. 10/079,985, all or at least a portion of the components of the MEMS device, e.g., the actuator 12, the actuable element 14 and/or the cantilever 24 (or other control mechanism), may be constructed from one or more layers of the substrate 54 to reduce the extent of the MEMS device 10 in a direction perpendicular from the substrate surface. Alternatively, all or portions of the components of the MEMS device 10 may be constructed on the surface of the substrate 54 through deposition processes or a combination of additive/subtractive processes.

The MEMS device 10 can provide precise electronic control of the position of the actuable element 14. Operation of the MEMS device 10 can be understood in the following manner. An external power source (not shown) can provide an operating current that can be communicated to the actuator 12 through the first and second leads 18, 19, respectively. After receiving an operating current, the actuator 12 may selectively apply a first force to the actuable element 14. The first force can tend to displace the actuable element 14 relative to the gap 8 along a path 6 that may be substantially parallel to the axis of actuation 26. The displacement of actuable element 14 can result in bending of the cantilever 24, which can effectively apply a second force to the actuable element 14. Like the first force, the second force also may act along the axis of actuation 26. Unlike the first force, however, the second force may act in an opposite direction, tending to restore the actuable element 14 to its original position on the path 6 and tending to limit the displacement of actuable element 14 along the path 6. Based on known beam theory analysis of the cantilever 24, the second force may increase as the displacement of actuable element 14 increases along the path 6. Thus, for a given first force, there can be a displacement of actuable element 14 where the second force balances the first force.

Upon removal of the first force, as by removal of the operating current, the second force restores the actuable element 14 to its original position on the path 6, i.e., the cantilever 24 may return to its original unbent or relaxed, position. By varying the operating current to the MEMS actuator 12, the MEMS device 10 provides precise electronic control of the displacement of the actuable element 14 along the path 6. In the embodiment of FIG. 1, the second force can be provided by the cantilever 24. Other embodiments may include other means, including a clamp, spring, suspension system, or a second MEMS actuator to control the displacement of actuable element 14 along the path 6, as may be further described in U.S. patent application Ser. No. 10/079,985.

As shown in FIGS. 1A, 1B, and 1C, each of the path 6, the actuator 12, and the actuable element 14 can lie in a plane that can be substantially parallel to the substantially planar surface of the substrate 54. Alternately, any combination of the path 6, the actuator 12, and the actuable element 14 may lie in a plane that can be inclined at an angle to the substantially planar surface of the substrate 54. Also alternately, the path 6 may include constituent portions that may not be coplanar with each other, the actuator 12 may include constituent portions that may not be coplanar with each other, and the actuable element 14 may include constituent portions that may not be coplanar with each other. Additionally, the path 6, the actuator 12, and the actuable element 14 may not be coplanar with each other.

The actuator 12 can include a magnetic core 30 and an electrically conductive coil 32 (shown partially in FIG. 1A for clarity) wrapped around the core 30 in a manner analogous to a solenoid or a toroid. Preferably, the actuator 12 is substantially planar, and lies in a plane that is substantially parallel to the substantially planar surface of the substrate. The core 30 can have a substantially circular shape when viewed from above and may have a substantially rectangular cross-section that has an extent that is substantially constant across the circumference of the core 30. Alternately, the core 30 may have a variety of shapes when viewed from above and a variety of cross-section shapes. For example, these shapes may include the shape of any type of oval, including an ellipse and a circle, any type of polygon, including a rectangle, a square, and a triangle, and the shape of any type of semi-oval, including a semi-circle. Also alternately, the cross-section may have an extent that varies across the circumference of the core 30.

The core 30 can have a first core end 34 and a second core end 36 separated from each other by the gap 8. The gap 8 can have a size and shape that can permit the displacement of actuable element 14 therethrough. The size and shape of gap 8 may depend on a variety of core parameters including the core shape and the core composition. The width of the gap 8, or gap distance d between core ends 34, 36, and the cross-sectional areas of the first and second core ends 34, 36 can be varied to adjust the strength of the magnetic field generated at the gap 8. The magnetic field strength will decrease with increasing gap distance d, and/or decreasing cross-sectional areas of core ends 34, 36. The size and shape of the gap 8 may also depend upon the limitations of the fabrication process.

As previously described, the base 20 of actuable element 14, or a portion of the base 20 may be constructed from a magnetic material (e.g., permanent or soft magnetic material), or may have a layer of magnetic material thereon. Displacement of the actuable element 14 along the path 6 through the gap 8 may depend, at least in part, upon the relationship between the magnetic field generated in the gap 8 by the actuator 12, as previously described, and the magnetic dipole properties of the magnetic material of base 20. The magnitude of the activation force that tends to pull or push the actuable element 14 along the path 6, and hence the displacement of the actuable element 14 along the path 6 may depend on the volume of magnetic material within the gap 8. The volume of the magnetic material provided on base 20 can be varied to adjust the magnitude of the force acting on the magnetic material. Varying at least one of or a combination of the width, height, or length of magnetic material may vary the volume of magnetic material on the base. For example, as the width of magnetic material in the gap 8 becomes smaller, the force acting on the magnetic material may also become smaller.

In the embodiment of FIGS. 1A, 1B and 1C, the displacement of actuable element 14 along the path 6 may be controlled by the action of cantilever 24. As described previously, bending of cantilever 24 under the influence of the force on base 20 resulting from the magnetic field applied at gap 8 can control the amount of displacement of actuable element 14 along the path 6. From well-known beam theory analysis, the resultant displacement in the plane of FIG. 1 perpendicular to a longitudinal axis 38 of cantilever 24 may vary as the cube of the width W of the cantilever 24. Thus, small variations in the width of cantilever 24, as may result from limitations in the fabrication, can result in large variations in the displacement of actuable element 14 along the path 6.

Figure 2A:
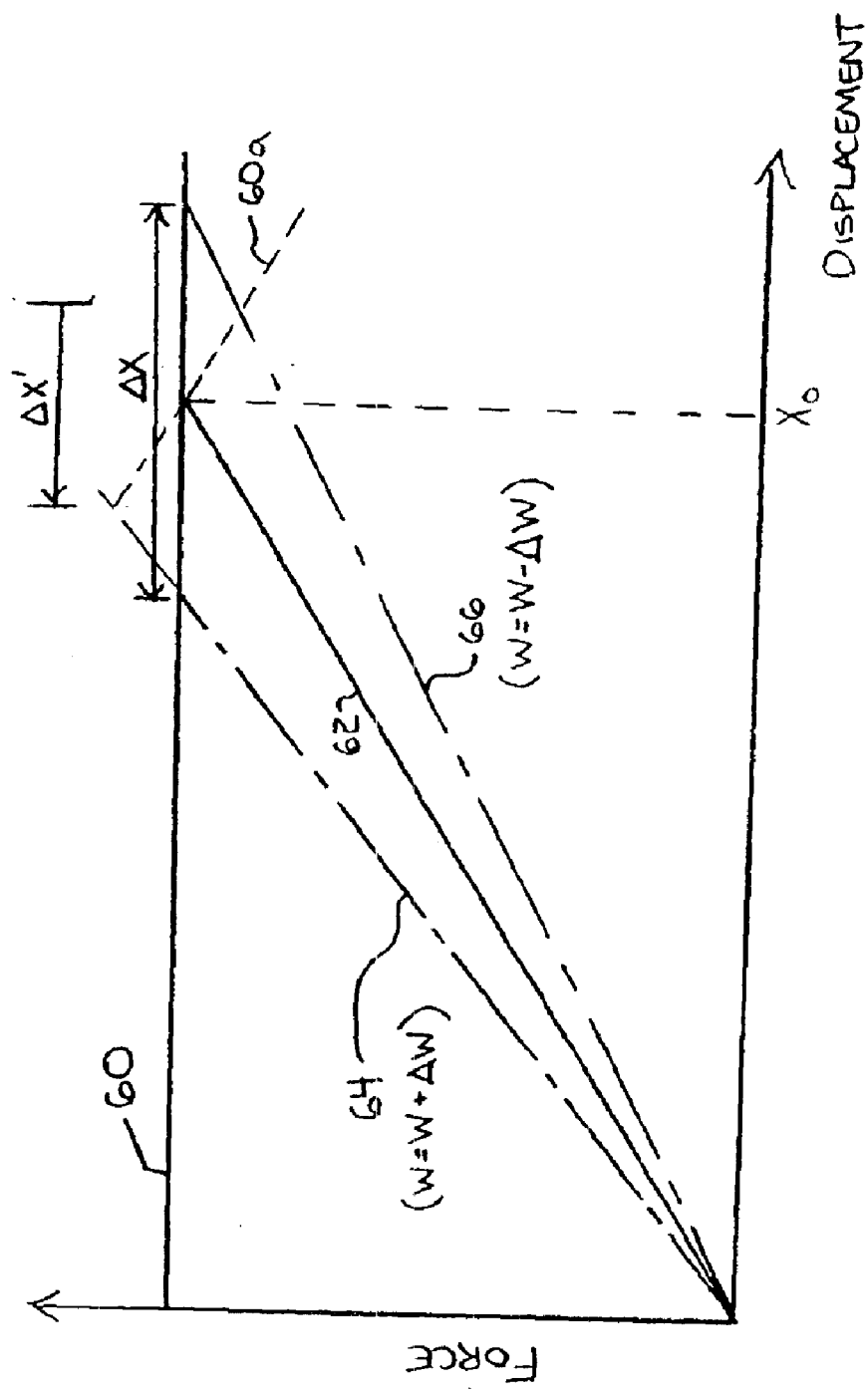
FIGS. 2A–2B are plots of the relationship of forces acting on an actuable element of a MEMS device to the displacement of the actuable element.
Figure 2B:
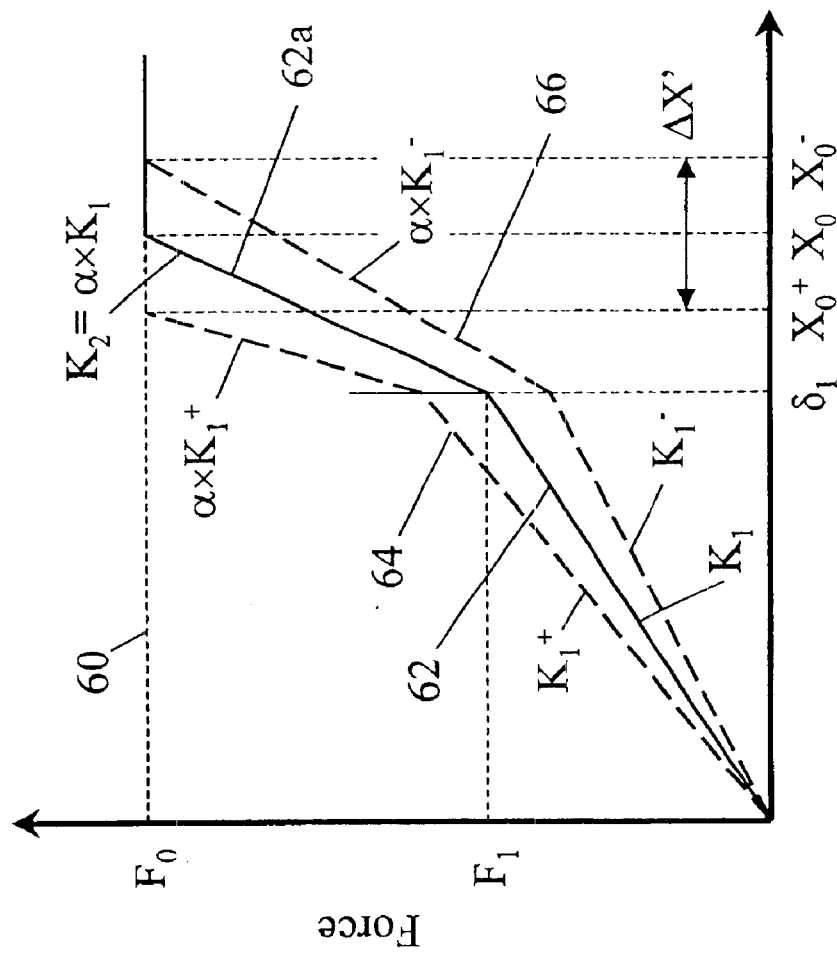

The relationships of the first force, i.e., the force resulting from the magnetic field acting on the magnetic material of the base 20 at gap 8, and the second force, i.e., the force due to bending of the cantilever 24, to the displacement of the actuable element 14 along the path 6 can be shown in FIGS. 2A and 2B. In the illustrated embodiment, the first force is constant as the actuable element is advanced through the gap. To achieve a desired displacement $X_0$ of the actuable element 14, a constant first force can be applied to actuable element 14, as indicated by line 60. Upon applying the first force, displacement of the actuable element 14 may increase until the second force may equal the first force, as indicated by line 62.

Changes in the width of cantilever 24 can result in changes in the stiffness, or bending resistance, of cantilever 24. In FIG. 2A, the change in stiffness can be reflected in the slope of line 62. By increasing the width of cantilever 24 by an amount $\Delta W$, the stiffness of cantilever 24 may be increased, as indicated by the increased slope of line 64 with respect to line 62. The resultant displacement may be decreased, as indicated by the intersection of line 64 and line 60. In a similar fashion, decreasing the width of cantilever 24 by an amount $\Delta W$ may decrease the stiffness of cantilever 24 and the resultant displacement may be increased, as indicated by line 66. Thus, the $\pm \Delta W$ variation in the width of cantilever beam 24 can result in a total variation of $\Delta X$ in the displacement of actuable element 14.

Figure 3A:
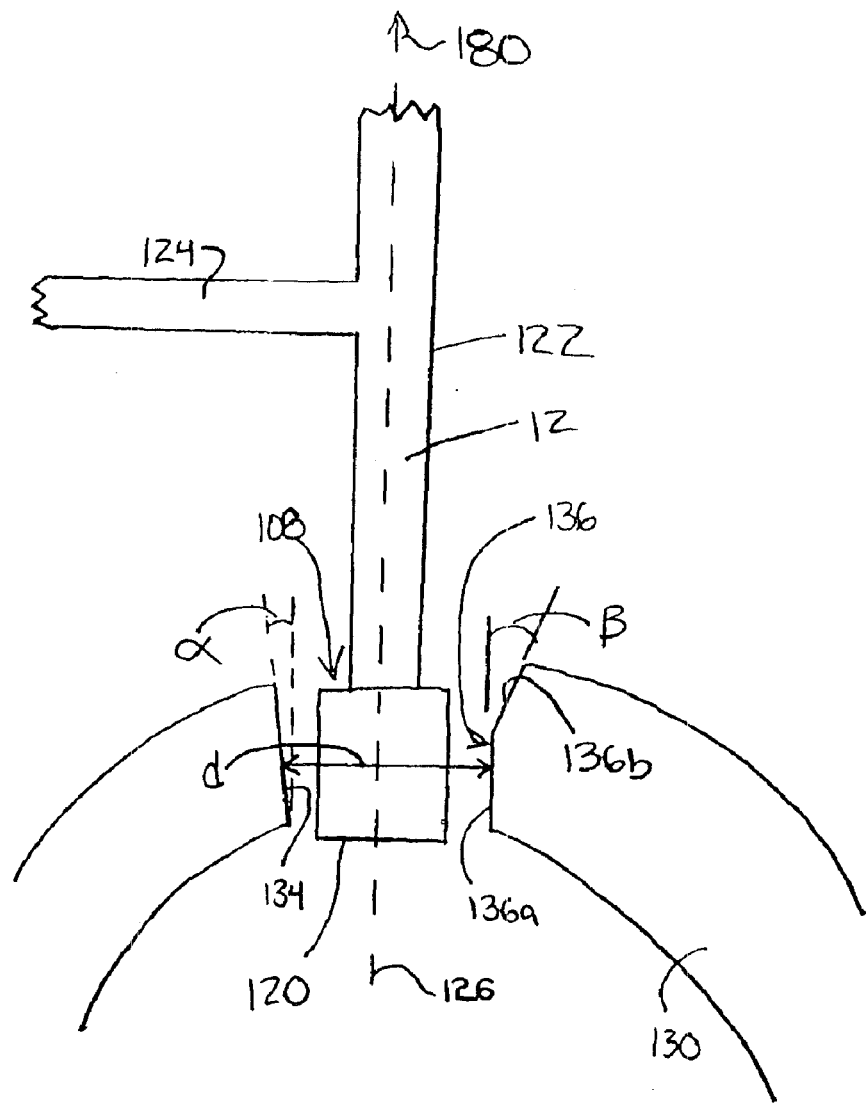
FIG. 3A is a partial top view of the MEMS device of FIG. 1A, enlarged to show detail.

It can be seen from FIG. 2A, that, for the same $\pm \Delta W$, if the first force can be made to be decreasing near the desired displacement, as indicated by line 60a, the variation in the displacement can be lessened, as indicated by $\Delta X'$, where $\Delta X' < \Delta X$. As previously described, the actuation force exerted on actuable element 14 can depend on the strength of the magnetic field and also on the volume of magnetic material within gap 8. FIG. 3A provides a detailed view of the base 120 of actuable element 114, first and second core ends 134, 136 and gap 108. In the embodiment of FIG. 3A, base 120 can be rectangular and may be fabricated from a magnetic material, or may have a layer of magnetic material thereon. Thus, for the embodiment of FIG. 3A, the amount of magnetic material within gap 108, as actuable element 114 travels through gap 108, can remain constant.

However, the strength of the magnetic field in the gap 108 can be varied by changing a gap distance d between first and second core ends 134, 136. The gap distance d can be varied by angling all or a portion of one or both core ends 134, 136 with respect to the axis of actuation 126. In FIG. 3A, core end 134 can form an angle α with axis 126. Core end 136 can have a first portion 136a parallel with axis 126 and a second portion 136b can form and angle β with axis 126. Thus, core ends 134, 136 may have differing shapes and the angles α and β may differ. Angling of core ends 134, 136, as shown in FIG. 3A, can result in the gap distance d increasing in the direction corresponding with the increasing displacement shown in FIG. 2 and illustrated by arrow 180 in FIG. 3A. It can be understood that the angling of core ends 134, 136 may be such as to increase or decrease the gap distance d in the direction 180. Also, the gap distance d can be made to increase over a portion, remain constant over a portion and/or decrease over a portion, in any desired order and/or combination. It can also be understood that core ends 134, 136 may be curved, such that the gap distance d may vary non-linearly.

Figure 3B:
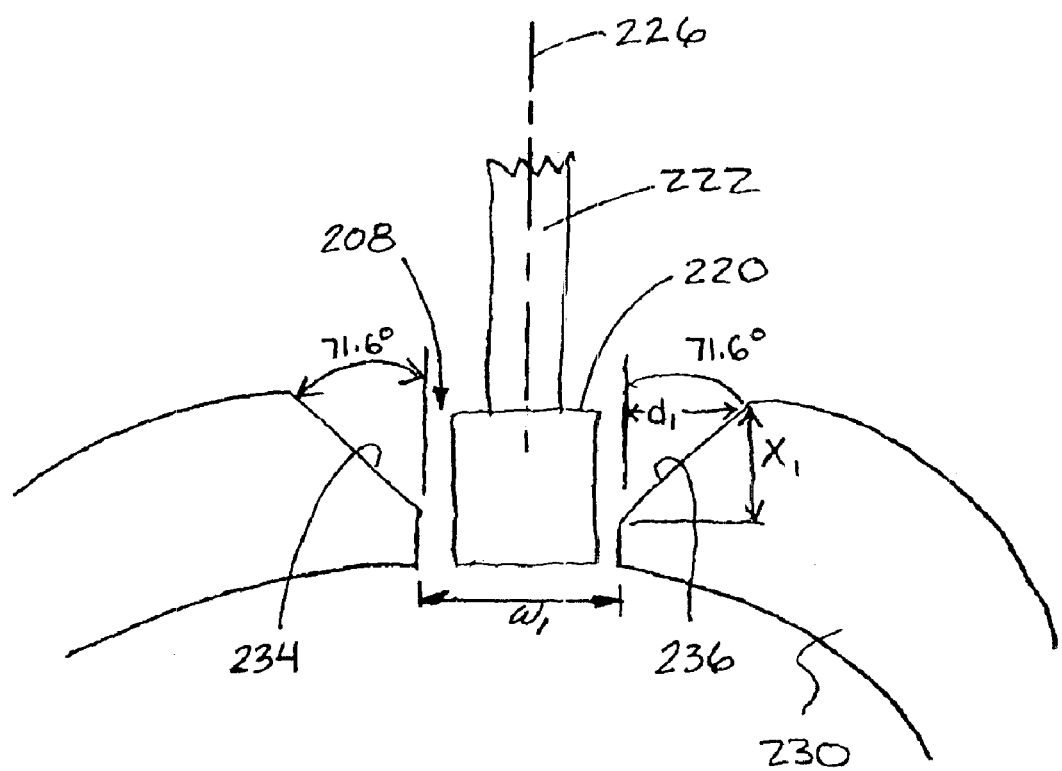
FIG. 3B is a partial top view of an exemplary embodiment of the MEMS device of FIG. 1A, enlarged to show detail.

In a preferred embodiment shown in FIG. 3B, core ends 234, 236 can be angled symmetrically about axis 226, i.e., the angle α may be equal to the angle β. For the preferred embodiment of FIG. 3B, the angles α and β may be chosen such that $\tan(\alpha)=\tan(\beta) \approx 3.0$, or $\alpha=\beta \approx 71.6°$. In the embodiment of FIG. 3B, $d_1$ may be approximately 63 μm, $x_1$ may be approximately 21 μm and the gap 208 may have a first width $w_1$ of approximately 60 μm. The magnetic material on base 220 may have an extent between core ends 234, 236 of approximately 50 μm and may have an extent along the axis 226 of approximately 100 μm. In this embodiment, the magnetic field strength between the core ends 234, 236 will decrease as the gap distance d increases. As base 220 of actuable element 214 moves through gap 208 in the direction of arrow 280, the force exerted on the magnetic material of base 220 will decrease. Thus, the force exerted may generally follow the shape of line 60a in FIG. 2 and the fabrication variations in the width of cantilever 224 may be have a diminished effect on the variation of the displacement, ΔX. For the embodiment of FIG. 3B, the decreasing force may be realized at a displacement of around 35 μm to provide a desired displacement $X_0$ of about 40 μm, with a ±5% accuracy.

Figure 4:
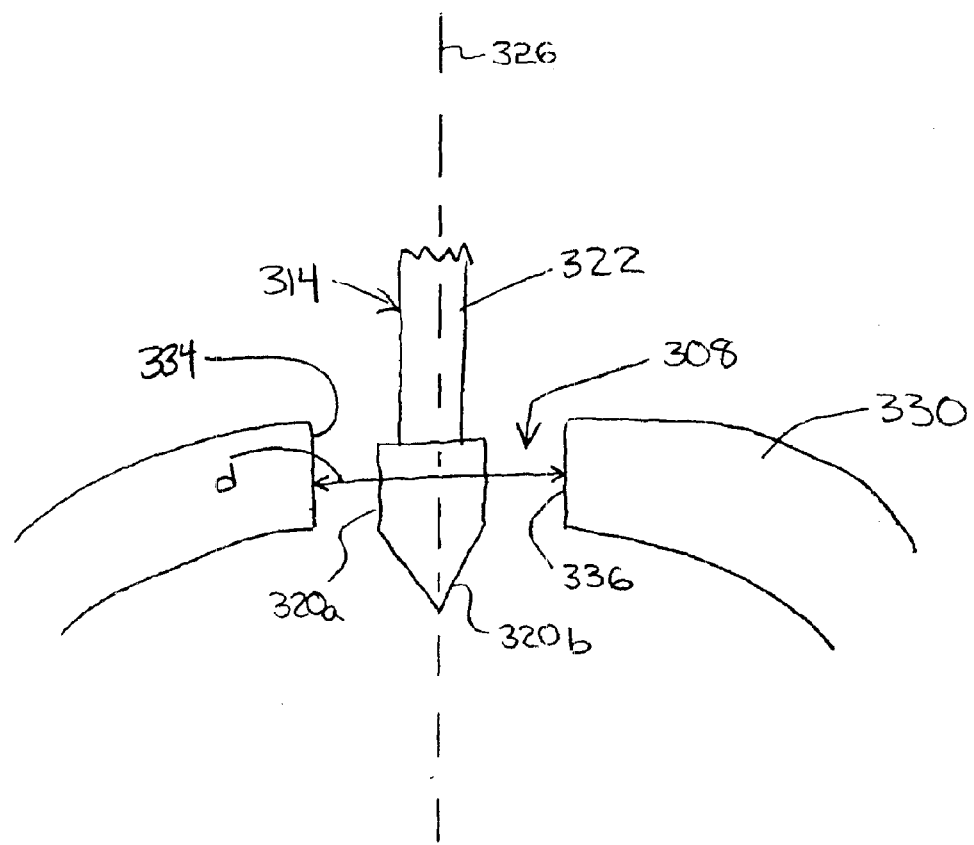
FIG. 4 is a partial top view of the MEMS device of FIG. 1A, enlarged to show detail

As previously noted, the force exerted on the magnetic material of base 20 may depend on the volume of magnetic material within gap 8. FIG. 4 provides a detailed view of the base 320 of actuable element 314, first and second core ends 334, 336 and gap 308 of an embodiment of the MEMS device 310. As in FIG. 3A, base 320 of FIG. 4 may be fabricated of magnetic material, or may have a layer of magnetic material thereon. In the embodiment of FIG. 4, core ends 334, 336 may be parallel with respect to axis 326. Thus, for the embodiment of FIG. 4, the gap distance d may remain constant. However, in the embodiment of FIG. 4, the volume of magnetic material provided on base 320 may be varied to effect a change in the magnetic moment of the base 320. In the illustrated embodiment of FIG. 4, a layer of magnetic material is deposited over the entire top surface of the base 320. However, it can be understood that, the layer of magnetic material need not conform to the shape of the top surface of the base 320. For example, the layer of magnetic material may be applied to a portion of the top surface of the base 320 or another portion of the base 320.

In the illustrated embodiment of FIG. 4, base 320, and thus the corresponding layer of magnetic material, may have a first portion 320a having a constant width and a tapered portion 320b having a width that can vary along the length of base 320, i.e., along the axis 326. In the embodiment shown in FIG. 4, the width of tapered portion 320b can be seen to taper symmetrically about the axis 326, with the width of base portion 320 within the gap 308 decreasing as actuable element 314 may move in the direction of arrow 380. By decreasing the width of base portion 320 and, thus, the corresponding layer of magnetic material deposited on the base 320, the volume of magnetic material provided on the base 320 is reduced, resulting in a decrease in the actuation force applied to the actuable element 314 as the actuable element advances through the gap. In a manner similar to that described in relation to FIG. 3B, the force exerted may generally follow the shape of line 60a in FIG. 2 and the fabrication variations in the width of cantilever 324 may be have a diminished effect on the variation of the displacement, ΔX.

It will be understood that in other embodiments the width, length, and/or height (i.e., thickness) of magnetic material provided on the base portion 320 can be varied to vary the volume of magnetic material provided on the base. For example, the width of tapered portion 320b may taper from one side or the other of base portion 320, or the taper may be only a partial taper, i.e., the taper may not extend over the full width of base portion 320. Additionally, the taper need not be linear, but may vary along the length of tapered portion 320b. Further, tapered portion 320b may extend the full length of base 320, i.e., there may be no first, or constant width, portion 320a, or the tapered portion 320b may be interchanged with the first portion 320a, such that the tapered portion 320b may be adjacent elongated arm 322 of actuable element 314 in FIG. 4. It can also be understood that the width of tapered portion may increase or decrease in the direction of arrow 380, or portions may have an increasing width, while other portions may have a decreasing width, or a constant width. In certain exemplary embodiments, the height (i.e., thickness) of all or a portion of the magnetic layer may be varied.

In certain exemplary embodiments, both the volume of magnetic material provided on base 320 and the gap distance d may be varied to increase and/or decrease the activation force on the actuable element 314 as it advances through the gap 308.

Figure 5A:
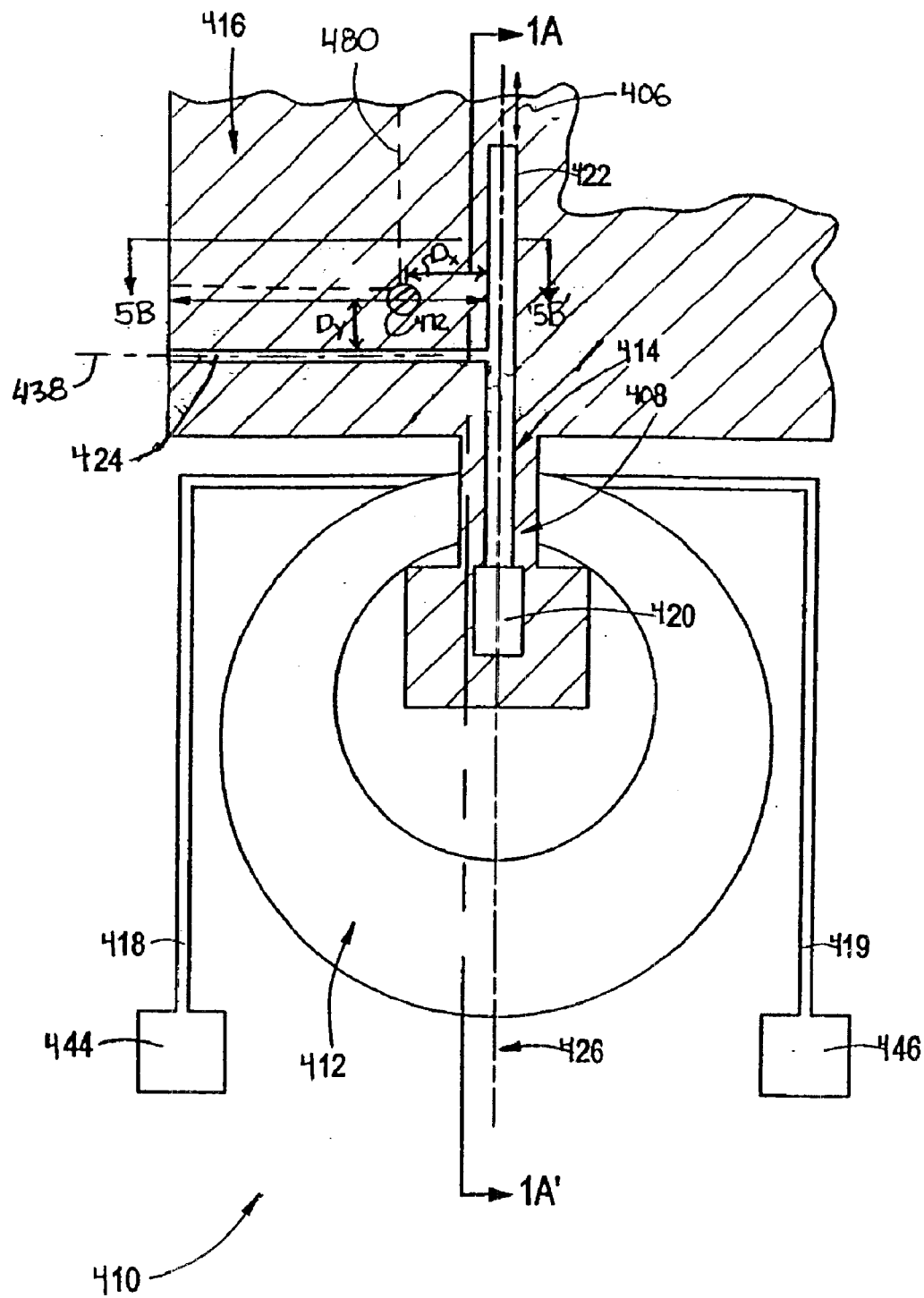
FIG. 5A is a top view of an embodiment of a MEMS device disclosed herein.
Figure 5B:
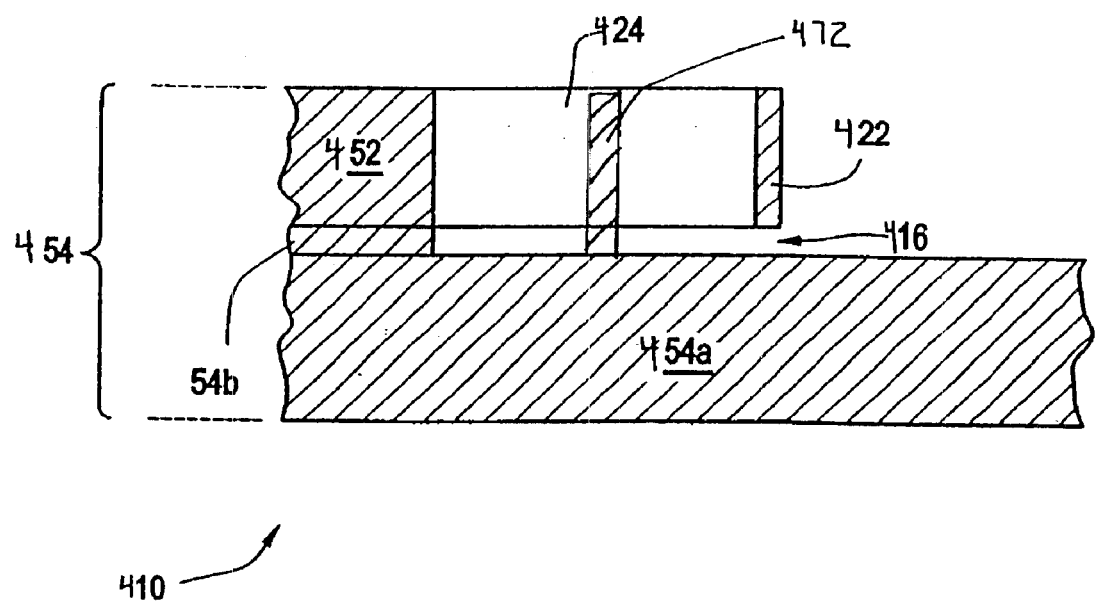
FIG. 5B is a side elevation view of the MEMS device shown in FIG. 5A along the line B–B'.

It can also be understood that the stiffness of cantilever 24 or other control mechanism may be varied such that the same ΔW can have less effect on the variation in the displacement, ΔX. Referring to FIGS. 5A and 5B, there can be shown top and side elevation views of an exemplary embodiment of a MEMS device 410, corresponding to FIGS. 1A and 1C, respectively, of MEMS device 10, that can be fabricated to have an effective stiffness that increases after a known displacement may be reached. A pin 472 can be constructed from the substrate 454, and can extend the depth of substrate 454. Pin 472, or other suitable structure, may be positioned in the deflection path of cantilever 424 to alter the stiffness of the cantilever upon contact with the cantilever. When the magnetic field at gap 408 between core ends 434, 436 acts on the magnetic material of base 420 of actuable element 414 to move actuable element 414 in the direction of arrow 480, cantilever 424 can deflect in the manner of cantilever 24 of FIG. 1, until cantilever 424 contacts pin 472.

When contacted by cantilever 424, the pin 472 can provide additional support for cantilever 424, thus increasing the force required to obtain the desired displacement $X_0$ compared to a similar cantilever without the pin 472, e.g., effectively increasing the spring constant $K_1$ of the cantilever. Referring FIG. 2B, the increased resistance to bending can be reflected in steeper slopes of lines 62, 64 and 66, with consequent reduction of the variation in the displacement, $\Delta X$. Line 62a can illustrate the relationship of the bending force of a cantilever 424 to the displacement of actuable element 414. As can be seen, the slope of line 62a can increase, i.e., the resistance to bending can increase (spring constant increases from $K_1$ to $K_2$), when cantilever 424 contacts pin 472.

Figure 5C:
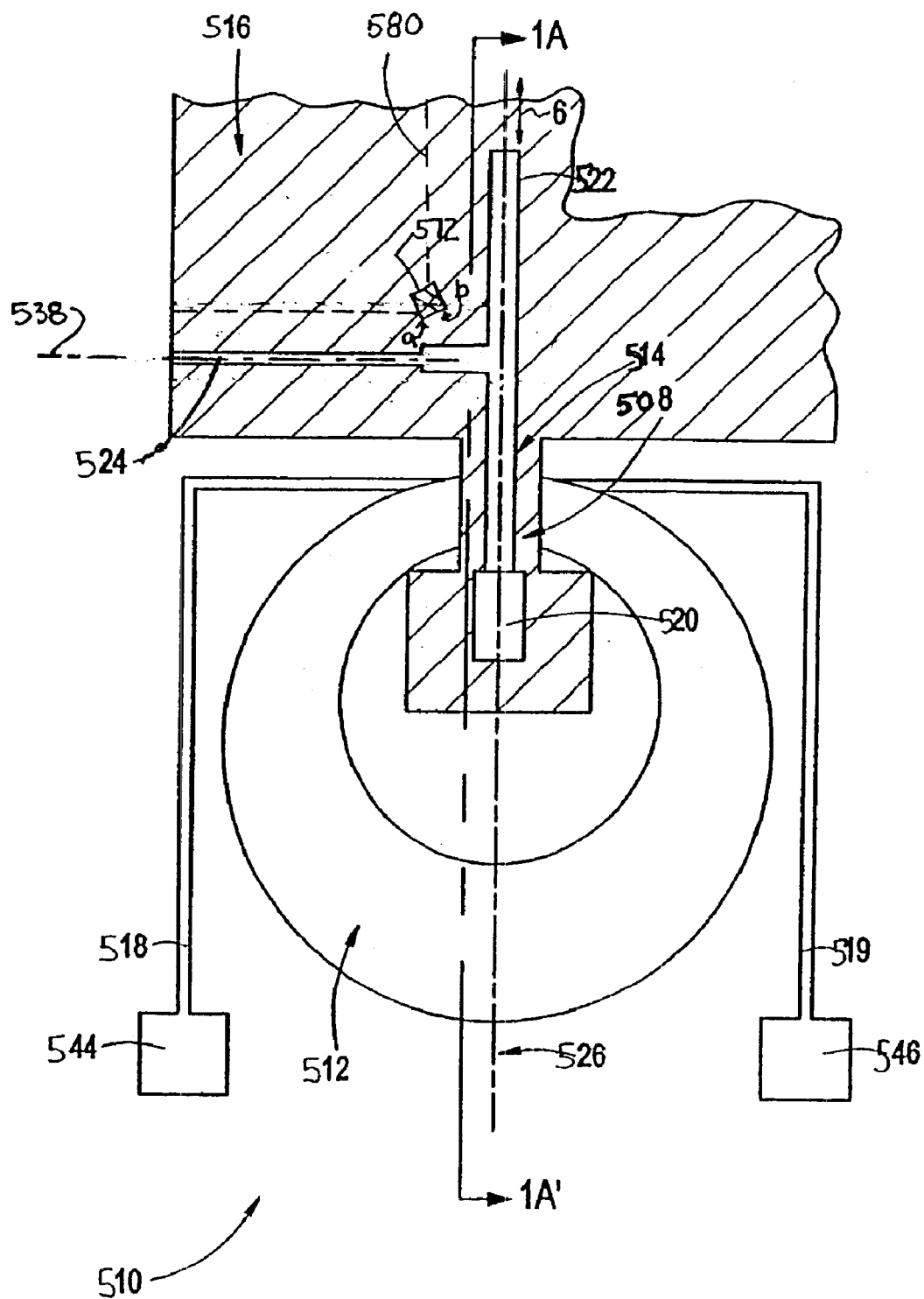
FIG. 5C is a top view of another embodiment of the MEMS device.

FIG. 5C is a top view, corresponding to FIG. 5A, of one embodiment of cantilever 524, wherein the width of cantilever 524 can be increased along a length of cantilever 524 from the point at which the cantilever 524 contacts the pin 572 to the end of cantilever 524 coupled to actuable element 514. The increased width can provide additional stiffness to further increase the slope of line 62a. It can be understood that increasing a depth of cantilever 524 may also increase the stiffness or bending resistance of cantilever 524. Conversely, decreasing a depth of the cantilever 524 may also decrease the stiffness or bending resistance of cantilever 524. While the embodiments of FIGS. 5A, 5B and 5C may be described in relation to an electromagnetic actuator, it can be understood that actuator 412, 512 may be another type of MEMS actuator such as, for example, an electrostatic, thermal, magnetostrictive, or piezoelectric actuator or any other type of MEMS actuator.

In cross-section, pin 472 may be round, as may be shown in FIG. 5A, oval, oblong, or other arcuate shape as may be desired. Additionally, in one embodiment illustrated in FIG. 5C, pin 572 may have a polygonal cross-section. A polygonal cross-section can provide a plurality of points where cantilever 524 can contact pin 572, with bending resistance increasing as cantilever 524 contacts the successive contact points. FIG. 5C illustrates an embodiment having two contact points designated a and b, respectively. Cantilever 524 may first make contact at point a of pin 572, with a concomitant increase in bending resistance. As the displacement of actuable element 514 and bending of cantilever can continue to increase, cantilever 524 may then make contact at point b of pin 572, with a further increase in bending resistance. It can be understood that pin 572 may be shaped to provide additional contact points as may be needed to attain the desired displacement. In one embodiment, multiple pins may be provided to provide multiple contact points. It can be understood from the above description that other configurations of pin 472, 572 may be used. As an example, pin 472, 572, or other motion limiting structure, need not be placed within cavity 416, 516, but may be a portion of an end wall 480, 580 of the MEMS device 410, 510, as indicated in phantom in FIGS. 5A, 5C.

Figure 6A:
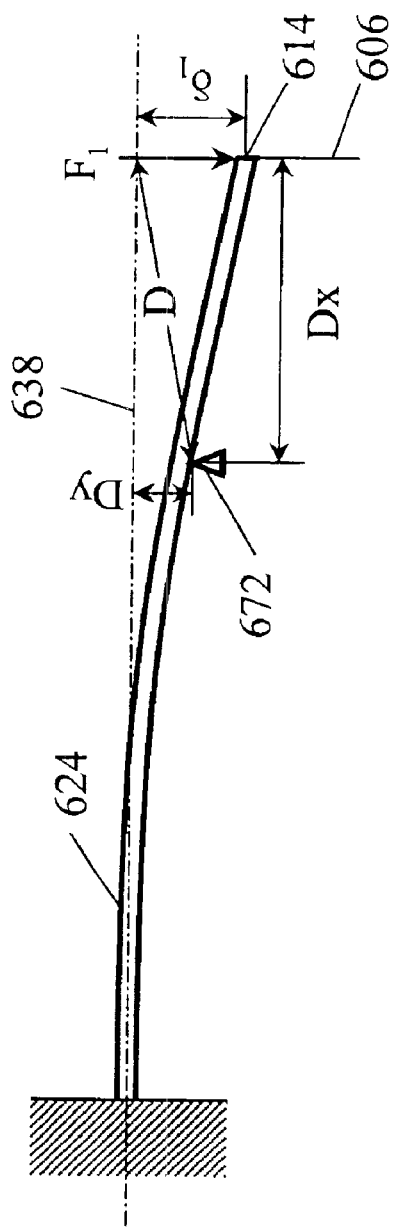
FIG. 6A is a schematic representation of a cantilever of the MEMS device subjected to a first force.
Figure 6B:
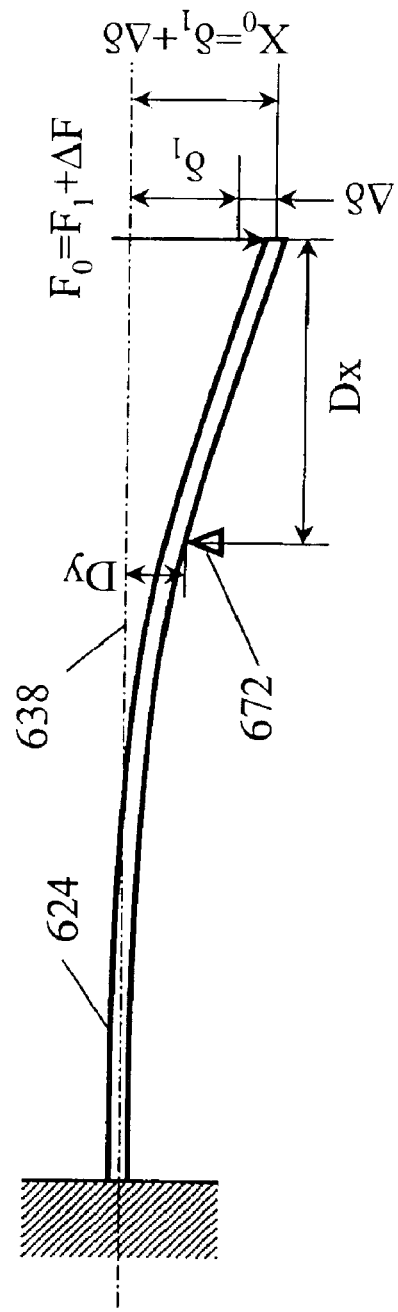
FIG. 6B is a schematic representation of the cantilever subjected to an increased force.
Figure 6C:
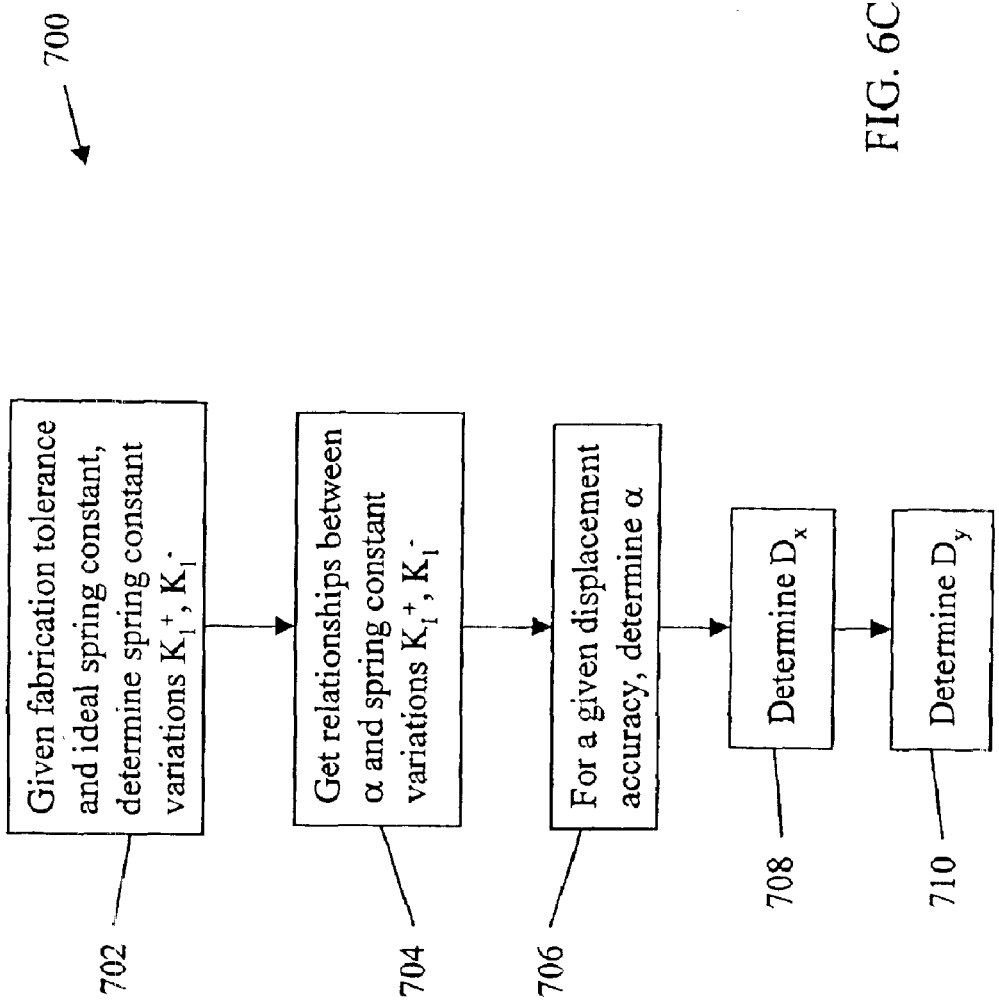
FIG. 6C is a flow chart of a method for determining the placement of a means for altering a spring constant of the cantilever.

The location of pin 472 may depend on the forces to applied to the actuable element and the desired displacement of the actuable element. FIGS. 6A, 6B and 6C illustrate an exemplary methodology for determining the location of the pin 672. FIG. 6A illustrates a cantilever 624 that is coupled at a distal end 614 to an actuable element, with pin 672 located a distance D from the rest position of distal end 614 of cantilever 624, i.e., a distance $D_x$ from the displacement path 606 of the actuable element and a distance $D_y$ from a longitudinal axis 638 of the cantilever 624. A displacement $\delta_1$ of the distal end 614, resulting from a force $F_1$, can be such that cantilever 624 can contact pin 672. Using known beam formulas, the following relationships can be determined:

$$F_1 = 6EID_y/\{(2L+D_x)(L-D_x)^2\};$$

$$\delta_1 = 2L^3 D_y/\{(2L+D_x)(L-D_x)^2\}; \text{ and}$$

$$K_1 = F_1/\delta_1 3EI/L^3, \qquad [1]$$

where E is Young's modulus, I is the second moment of inertia of the cantilever 624, L is the length of cantilever 624 and $K_1$ is the spring constant of cantilever 624 as defined in relation with FIG. 2B.

The force on actuable element 614 may be increased to a force $F_0$, corresponding with line 60 of FIG. 2B, i.e., $F_0 = F_1 + \Delta F$, with a subsequent increase in the deflection of cantilever 624, to achieve the desired displacement, i.e., $X_0 = \delta_1 + \Delta\delta$, as illustrated in FIGS. 2B and 6B. Again using known beam formulas, the following additional relationships can be obtained:

$$X_0 = F_0 D_x^2(3L+D_x)/12EI + (2L+D_x)D_y/2(L-D_x) = (F_0-F_1)D_x^2(3L+D_x)/12EI + \delta_1;$$

$$K_2 = \Delta F/\Delta\delta = 12EI/D_x^2(3L+D_x); \text{ and}$$

$$\alpha = K_2/K_1 = 4L^3/D_x^2(3L+D_x), \qquad [2]$$

where $K_2$ can be the spring constant after cantilever 624 contacts pin 672 and $\alpha$ is the ratio of the spring constant $K_2$ to the spring constant $K_1$.

Using the above relationships, the following method 700, as illustrated in FIG. 6C, can be used to determine the placement of pin 672 in terms of $D_x$ and $D_y$, such that the displacement of the actuable element 614 can be controlled to within a desired displacement accuracy. Given the ideal spring constant $K_1$ for the cantilever 624, a known force $F_0$ and a fabrication tolerance $\Delta W$ in width W of cantilever 624, and since $K_1 \propto I \propto W^3$, the variations in the spring constant $K_1$ can be determined (702) from:

$$K_1^+ = K_1(1+\Delta W/W)^3 \text{ and } K_1^- = K_1(1-\Delta W/W)^3.$$

Using the above relationships for $\alpha$ and $K_1, K_2$, the following can be obtained (704):

$$\alpha K_1(X_0-\delta_1) = F_0 - K_1\delta_1;$$

$$\alpha K_1^+(X_0^+ - \delta_1) = F_0 - K_1^+ \delta_1; \text{ and}$$

$$\alpha K_1^-(X_0^- - \delta_1) = F_0 - K_1^- \delta_1. \qquad [3]$$

For a given desired displacement accuracy of $Y_0$, i.e., $(X_0^- - X_0^+)/X_0 < Y_0$, where $X_0^+$ can be a minimum tolerable displacement and $X_0^-$ can be a maximum tolerable displacement, $\alpha$ can thus be determined (706):

$$\alpha > F_0(1/K_1^- - 1/K_1^+)/(Y_0 X_0).$$

$D_x$ can then be determined from Equation 2 (708) and $D_y$ can then be determined from Equations 1 and 3 (710). It can be seen from FIG. 2B that the variation in the displacement, as indicated by $\Delta X'$, may be lessened from what may be expected without pin 672.

Referring back to FIG. 5A, it can be understood that the closer pin 472 may be placed to the axis of actuation 426, the greater the increase in bending resistance when cantilever 424 contacts pin 472. Also, the closer pin 472 may be placed to the longitudinal axis 438 of cantilever 424, the smaller the overall displacement of actuable element 414 may be. In one embodiment, multiple cantilevers 524 may be used and one or more pins 572 may be placed in the displacement path of one or more of the multiple cantilevers 524. Such multiple cantilevers may be described in more detail in U.S. patent application Ser. No. 10/079,985. It can further be understood that other mechanisms for controlling the displacement of actuable element 414, 514 may be used, such as may be described in further detail in U.S. patent application Ser. No. 10/079,985. In embodiments employing a spring control mechanism, pin 472, 572 may be positioned to contact the spring control mechanism to effectively increase the spring constant of the spring control mechanism in a manner analogous to increasing the spring constant $K_1$ of cantilever 424, 524.

It is known in the art that strong interfacial adhesion, commonly referred to as stiction, may be present between contacting microstructure surfaces, such as contacting surfaces of cantilever 524 and pin 572. When stiction can occur between contacting surfaces of cantilever 524 and pin 572, then actuable element 514 may not return to its rest, or relaxed, position when the magnetic field force is turned off. Known methods can be used to diminish stiction between cantilever 524 and pin 572, including texturing of one or both of the surfaces of cantilever 524 and pin 572 and applying an anti-stiction coating to one or both of the surfaces of cantilever 524 and pin 572.

While the MEMS devices disclosed herein have been particularly shown and described with reference to the exemplary embodiments thereof, those of ordinary skill in the art will understand that various changes may be made in the form and details herein without departing from the spirit and scope of the disclosure. Those of ordinary skill in the art will recognize or be able to ascertain many equivalents to the exemplary embodiments described specifically herein by using no more than routine experimentation. Such equivalents are intended to be encompassed by the scope of the present disclosure and the appended claims.

We claim:

1. A MEMS device comprising:
    an actuable element having a magnetic portion comprising a magnetic material, and
    an electromagnetic MEMS actuator comprising an electrically conductive coil wound about a magnetic core, the coil and the magnetic core being arranged to generate a magnetic field within a gap formed by spaced apart ends of the magnetic core upon application of a current to the coil, the actuable element being displaceable along a displacement axis relative to the gap upon application of the magnetic field on the magnetic portion of the actuable element,
    wherein at least one of the gap and the magnetic portion varies along the displacement axis.

2. The MEMS device of claim 1, wherein the displacement axis passes through the gap.

3. The MEMS device of claim 1, wherein the ends of the core are spaced-apart a gap distance to form the gap and the gap distance varies along the displacement axis.

4. The MEMS device of claim 3, wherein the gap distance decreases along the displacement axis.

5. The MEMS device of claim 3, wherein the gap distance increases along the displacement axis.

6. The MEMS device of claim 1, wherein the magnetic portion has a width and the width varies along displacement axis.

7. The MEMS device of claim 6, wherein the width increases along the displacement axis in a direction corresponding to displacement of the actuable element away from the gap.

8. The MEMS device of claim 6, wherein the width decreases along the displacement axis.

9. A MEMS device comprising:
    an actuable element having a magnetic portion comprising a magnetic material, and
    an electromagnetic MEMS actuator comprising an electrically conductive coil wrapped around a core having a first end spaced apart from a second end by a gap distance to form a gap, the actuable element being displaceable along a displacement axis that passes through the gap upon application of a magnetic field generated by the electromagnetic MEMS actuator on the magnetic portion of the actuable element,
    wherein the first end has an angled end surface oriented at an angle to the displacement axis.

10. The MEMS device of claim 9, wherein the second end has an angled end surface oriented at an angle to the displacement axis.

11. The MEMS device of claim 10, wherein the angled surfaces of the first end and the second end are symmetrical about the displacement axis.

12. The MEMS device of claim 11, wherein the angle is greater than 45°.

13. The MEMS device of claim 11, wherein the angle is greater than 70°.

14. The MEMS device of claim 9, wherein the angle is greater than 45°.

15. The MEMS device of claim 9, wherein the angle is greater than 70°.

16. The MEMS device of claim 9, wherein second end has a surface oriented parallel to the displacement axis.

17. A MEMS device comprising:
    an actuable element having a magnetic portion comprising a magnetic material, and
    an electromagnetic MEMS actuator comprising an electrically conductive coil wrapped about a magnetic core, the electromagnetic MEMS actuator being arranged to generate a magnetic field within a gap formed by spaced apart ends of the magnetic core upon application of a current to the coil, the actuable element being positioned proximate the gap and being displaceable along a displacement axis relative to the gap upon application of the magnetic field on the magnetic portion of the actuable element,
    wherein the magnetic portion has a first angled surface oriented at an angle to the displacement axis.

18. The MEMS device of claim 17, wherein the magnetic portion has a second angled surface oriented at an angle to the displacement axis.

19. The MEMS device of claim 18, wherein, the second angled surface and the first angled surface are symmetrically oriented about the displacement axis.

20. The MEMS device of claim 19, wherein the angle is greater than 45°.

21. The MEMS device of claim 19, wherein the angle is greater than 70°.

22. The MEMS device of claim 17, wherein the angle is greater than 45°.

23. The MEMS device of claim 17, wherein the angle is greater than 70°.

24. The MEMS device of claim 17, wherein magnet portion includes a surface oriented parallel to the displacement axis.

25. A MEMS device comprising:
    a substrate,
    an actuable element, an actuator disposed on the surface of the substrate for selectively applying a first force to the actuable element to displace the actuable element along a displacement path, at least one control mechanism coupled to the actuable element at a first end and coupled to the substrate at a second end to control displacement of the actuable element along the displacement path, and a pin coupled to the substrate and positioned in a deflection path of the control mechanism, the pin altering a bending resistance of the control mechanism upon contact with the cantilever.

26. The MEMS device of claim 25, wherein the pin has a contact surface configured to minimize stiction between the pin and the control mechanism.

27. The MEMS device of claim 26, wherein the contact surface is coated with anti-stiction coating.

28. The MEMS device of claim 26, wherein the contact surface is textured.

29. The MEMS device of claim 26, wherein the contact surface is arcuate in shape.

30. The MEMS device of claim 25, wherein the pin is arcuate in shape.

31. The MEMS device of claim 25, wherein the pin is cylindrical in shape.

32. The MEMS device of claim 25, wherein the pin has a polygonal cross-section.

33. The MEMS device of claim 32, wherein the control mechanism is a cantilever and the cantilever contacts the pin at two or more points on the polygonal cross-section of the pin.

34. The MEMS device of claim 25, wherein the control mechanism is a cantilever and the pin is positioned a distance D from the first end of the cantilever, the distance D being selected to increase the bending resistance of the cantilever.

35. The MEMS device of claim 25, wherein the control mechanism is a cantilever and the pin is positioned a distance $D_x$ from the displacement path and a distance $D_y$ from a longitudinal axis of the cantilever.

36. The MEMS device of claim 25, further comprising at least one additional pin coupled to the substrate and positioned in a deflection path of the control mechanism.

37. The MEMS device of claim 25, wherein the control mechanism is a cantilever and the cantilever has a cross-section defined by a cantilever width W and a cantilever height H and the cross-section of the cantilever varies along a longitudinal axis of the cantilever by varying at least one of the cantilever width W and the cantilever height H along the longitudinal axis of the cantilever.

38. A MEMS device comprising:

a substrate, an actuable element having a magnetic portion comprising a magnetic material, an electromagnetic MEMS actuator comprising an electrically conductive coil wound about a magnetic core, the coil and the magnetic core being arranged to generate a magnetic field within a gap formed by spaced apart ends of the magnetic core upon application of a current to the coil, the actuable element being displaceable along a displacement axis relative to the gap upon application of the magnetic field on the magnetic portion of the actuable element, a first cantilever coupled to the actuable element at a first end and coupled to the substrate at a second end, a second cantilever coupled to the actuable element at a first end and the substrate at a second end, and a pin coupled to the substrate and positioned in a deflection path of the first cantilever, the pin altering a bending resistance of the first cantilever upon contact with the first cantilever.

39. A MEMS device comprising:

a substrate, an actuable element, an actuator disposed on the surface of the substrate for selectively applying a first force to the actuable element to displace the actuable element along a displacement path, at least one cantilever coupled to the actuable element at a first end and coupled to the substrate at a second end to control displacement of the actuable element along the displacement path, and means for altering a bending resistance of the cantilever during displacement of the actuable element.

40. A MEMS device comprising:

a substrate, an actuable element, an actuator disposed on the surface of the substrate for selectively applying a first force to the actuable element to displace the actuable element along a displacement path, a mechanism for controlling displacement of the actuable element along the displacement path, and means for altering a spring constant of the mechanism for controlling displacement during displacement of the actuable element.

* * * * *

UNITED STATES PATENT AND TRADEMARK OFFICE
CERTIFICATE OF CORRECTION

PATENT NO. : 6,858,911 B2
DATED : February 22, 2005
INVENTOR(S) : Tamura et al.

It is certified that error appears in the above-identified patent and that said Letters Patent is hereby corrected as shown below:

Title page,
Item [75], Inventors, please replace "Hirokazu Tamura, Wellsley, MA (US);" with
-- Hirokazu Tamura, Wellesley, MA (US) --
Item [73], Assignees, please replace "Advanced Micriosensors" with -- Advanced Microsensors -- and please replace "Furukawa American, Inc." with -- Furukawa America, Inc. --

Column 10,
Line 10, please replace "$K_1 = F_1/\bar{o}_1 3E//L^3$" with -- $K_1 = F_1/\bar{o}_1 = 3E//L^3$ --

Signed and Sealed this

Seventeenth Day of May, 2005

JON W. DUDAS
*Director of the United States Patent and Trademark Office*